April 21, 1970 S. E. TOWNSEND 3,508,080

BRIDGE GATING NETWORK HAVING POWER GAIN

Filed Sept. 14, 1966 3 Sheets-Sheet 1

INVENTOR.
STEPHEN E. TOWNSEND

BY Anthony D. Cennamo

ATTORNEY

April 21, 1970 S. E. TOWNSEND 3,508,080

BRIDGE GATING NETWORK HAVING POWER GAIN

Filed Sept. 14, 1966 3 Sheets-Sheet 2

INVENTOR.
STEPHEN E. TOWNSEND

BY Anthony D. Cennamo

ATTORNEY

April 21, 1970 S. E. TOWNSEND 3,508,080

BRIDGE GATING NETWORK HAVING POWER GAIN

Filed Sept. 14, 1966 3 Sheets-Sheet 3

INVENTOR.
STEPHEN E. TOWNSEND
BY Anthony D. Cennamo
ATTORNEY 3,508,080
Patented Apr. 21, 1970

3,508,080

BRIDGE GATING NETWORK HAVING POWER GAIN

Stephen E. Townsend, Rochester, N.Y., assignor to Xerox Corporation, Rochester, N.Y., a corporation of New York Filed Sept. 14, 1966, Ser. No. 579,395
Int. Cl. H03k *17/00*
U.S. Cl. 307—254 3 Claims

ABSTRACT OF THE DISCLOSURE

A bridge gating network combining the functions of a bipolar gate and a bipolar amplifier circuit which requires only a small input signal and a small control signal in comparison with the gated output current.

This invention relates to electronic gate circuits. Gate circuits, of which many different types are known, are intended to provide essentially the same function as a relay switch contact, but at switching speeds greater than those obtainable with electromagnetic relays. Most gate circuits are only required to handle small currents on the order of a few milliamperes. Difficulties may arise where substantially larger currents are required including reversible currents, as in driving low impedance or capacitative loads. One approach is to use a high current source in conjunction with a gate having a high current carrying capacity. Such gates however, frequently require a large control current. Another approach is to use a low current gate followed by a current amplifier.

In accordance with the present invention there is provided a circuit combining the functions of a bipolar gate circuit and a bipolar amplifier circuit and which requires only a small input signal and a small control signal in comparison with the gated output current.

It is known that where repetitive switching is required, the control terminals of a gate circuit can be driven from a transformer, permitting the gate to simulate the electrical isolation of an idealized relay even though there may be a conductive path between the gate output and the gate control terminals. However, where a gate is required to stay open or closed for long periods of time a simple isolating transformer drive circuit becomes impractical and the gate must be driven from a drive circuit which is not isolated from ground. Under these conditions the gate drive circuit may appear as an undesirable load connected across the gate input and may couple undesired signals into the gate input or output. In accordance with the invention there is also provided means and methods for driving a gate so as to substantially simulate the advantages of an isolated driving circuit.

These objectives are achieved through the use of a gate circuit employing an NPN and a PNP transistor as combined gating and amplifying elements and through the use of a constant current source as a gate control element. Other objects and features of the invention will become apparent in connection with the more detailed description which follows.

Figure 1:
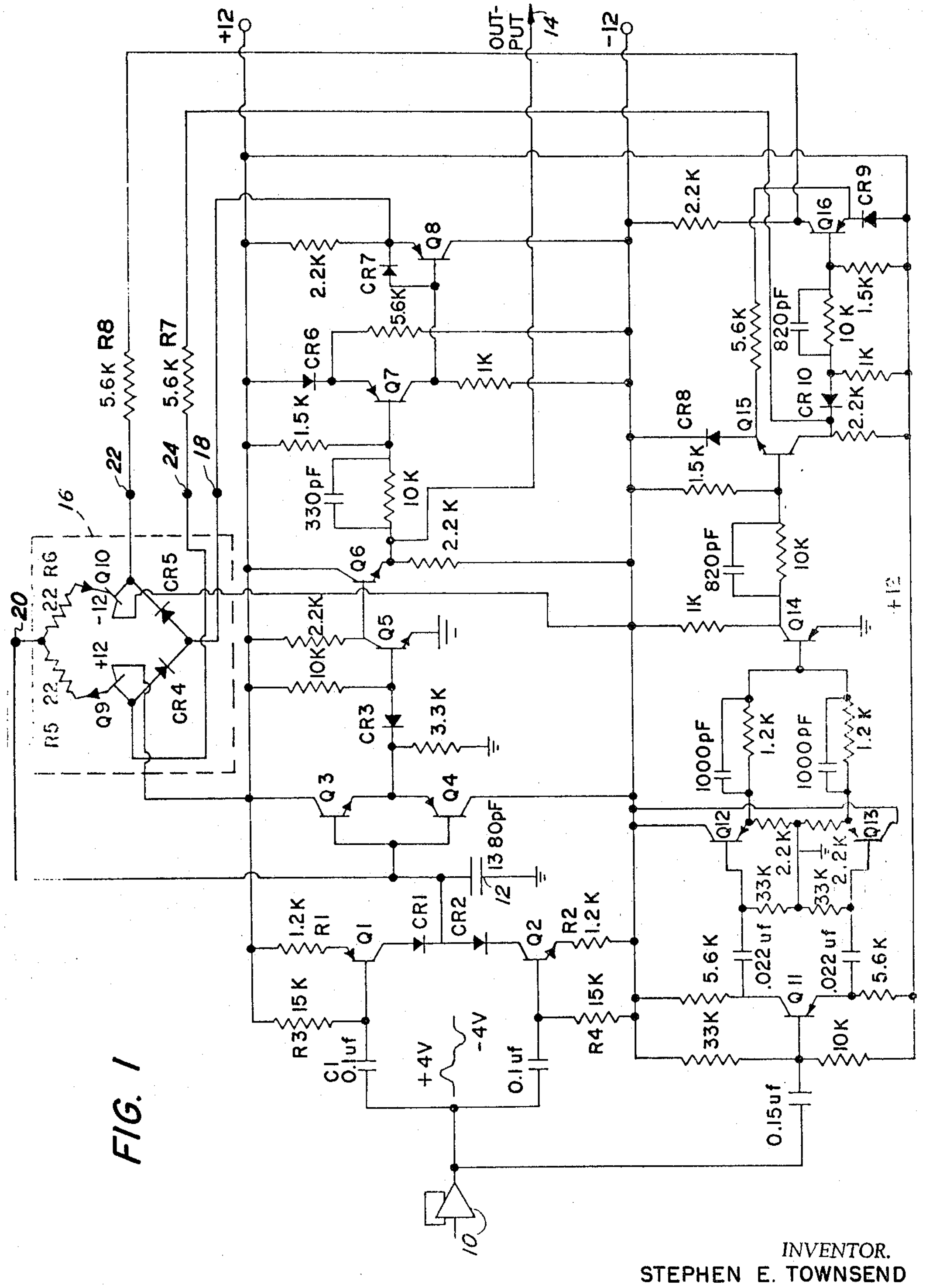
FIG. 1 shows a dicode decoding circuit including a gate circuit according to the invention.

FIG. 1 shows an illustrative dicode decoder circuit including an amplified gate circuit in accordance with the invention. With respect to the decoding function of the circuit, further reference may be had to Patent No. 3,462,695, entitled "Dicode Decoder With Interrupted Feedback" and filed on the same date as this application. An automatic gain control amplifier 10, shown schematically, provides an output dicode signal of eight volts peak-to-peak amplitude. Transistors Q1 and Q2 and associated components comprise a constant current amplifier. Q1 is a PNP transistor and Q2 is an NPN transistor. Their collectors are connected to an integrating capacitor 12 through diode CR1 and CR2 which minimizes loading on capacitor 12. The emitter and collector current in Q1 is essentially the base voltage divided by the emitter resistor R1 and, similarly, the emitter and collector of Q2 is the base voltage divided by the emitter resistor R2. R1 and R2 are normally equal to each other. The input signals are coupled to the bases of transistors Q1 and Q2 by coupling capacitors C1 and C2 respectively. This permits the transistor bases to be referenced to the plus and minus supply voltages by base resistors R3 and R4 respectively. The time constant of C1 and R3 and of C3 and R4 is made long enough to pass the input pulses without distortion. In general, transistor Q1 will supply capacitor 12 with a current proportional to negative input pulses and transistor Q2 will supply capacitor 12 with a current proportional to positive input pulses. The voltage on capacitor 12 will thus be the negative integral of the voltage supplied by automatic gain control amplifier 10.

The voltage on capacitor 12 is passed, via a high input impedance emitter follower composed of transistors Q3 and Q4 and through diode CR3 to the base of transistor Q5. Since the emitter of Q5 is grounded, its collector potential switches between ground potential and the positive supply potential as its base potential passes through a potential of a few tenths of a volt positive. A comparable fraction of a volt is added by CR3 to the emitter follower output, so that the base of Q5 passes through its switching potential when the emitter follower output passes through zero. Since Q5 is an NPN transistor its collector potential walls to zero when its base potential is positive and its collector potential rises to the value of the positive supply voltage when the base voltage is negative. Accordingly, Q5 functions as a threshhold circuit and the collector of Q5 is connected through emitter follower Q6 to the output terminal 14.

The potential at the emitter of Q6 varies in a direction opposite to that at capacitor 12 and is applied through a voltage divider to a common emitter transistor Q7. In order to assure positive turn-off of Q7, its emitter is returned to a potential which is a few tenths of a volt more negative than the positive supply voltage by virtue of the forward voltage drop across diode CR6. Thus, the potential at the collector of Q7 is either substantially equal to the positive supply voltage or substantially equal to the negative supply voltage and is in phase with the potential in capacitor 12. The collector of Q7 is connected to the input of emitter follower Q8, the output of which is connected through a gate 16 back to capacitor 12. A diode CR7 ensures that Q8 will have a low output impedance regardless of whether it is turned on or off. Accordingly, when gate 16 is opened, capacitor 12 always tries to charge up to or down to the collector potential of Q7.

The input signal from amplifier 10 is also applied to a phase inverter transistor Q11, the outputs of which are connected to transistors Q12 and Q13. Any input signal above a very low threshold value will cause either Q12 or Q13 to conduct, depending upon the polarity of the input signal. The emitters of Q12 and Q13 are coupled to the base of grounded emitter transistor Q14, so that Q14 will be turned on whenever either Q12 or Q13 is turned on. When Q14 is turned on it biases NPN transistor Q15 to the on state and Q15 biases NPN transistor Q16 on through a coupling diode CR10. Diodes CR8 and CR9 insure that Q15 and Q16 are solidly turned off except when Q14 conducts. Diode CR10 permits the collector potential of Q15 to return rapidly to the collector supply potential when Q15 is turned off. The collector outputs of Q15 and Q16 constitute a push pull signal which appears only when a voltage above a minimum absolute threshold value is applied to Q11. This output is used, through resistors R7 and R8, to switch on gate 16 which is illustrative of an amplified gate in accordance with the present invention.

When gate control terminal 22 is positive and gate control terminal 24 is negative, diodes CR4 and CR5 will both be back biased and input terminal 18 will be electrically isolated from the gate. At the same time, the positive potential at terminal 22 will bias transistor Q10 off and the negative potential at terminal 24 will bias transistor Q9 off, so that output terminal 20 is similarly isolated from the gate. When transistors Q15 and Q16 are turned on, the potential supply to terminals 22 and 24 will be reversed. In the illustrated embodiment the signal applied to input terminal 18 is a two-level signal having values of plus 12 or minus 12 volts. If the input signal is plus 12 volts diode CR4 will be slightly back biased and transistor Q9 will be supplied with a drive current through resistor R7 and drive terminal 24, and transistor Q10 will be biased off. Under these conditions output terminal 20 will drive capacitor 12 toward a potential of plus 12 volts with a current which is greater than that supplied through resistor R7 by a factor equal to the current gain of transistor Q9. Stated differently, the gate drive current is less than the gate output current by a factor equal to the transistor current gain. When the input potential at terminal 18 is at minus 12 volts the operation of the gate will be exactly the opposite of that described. Resistors R5 and R6 should preferably be included to insure against any possibility that both Q9 and Q10 might simultaneously conduct high currents since this could cause the destruction of the transistors. The relatively small voltage drop across the resistor associated with the conducting transistor appears as a reverse bias at the emitter of the nonconducting transistor.

In the above described mode of operation the gate circuit acts as a limiter or as a digital gate since the output terminal 20 is driven towards either the positive or negative voltage supplied at control terminals 22 and 24 at a current which is determined primarily by resistors R7 and R8. However, the gate may also be employed in a linear or analog fashion as long as the input signal applied at terminal 18 is less than the control voltage applied at terminals 22 and 24. Under these conditions diodes CR4 and CR5 will both conduct and the voltages on the bases of transistors Q9 and Q10 will be the same as the voltage at input terminal 18, except for the forward diode drops across diode CR4 and CR5, which also act to forward bias transistors Q9 and Q10. The voltages on the transistor bases are of course the same as those on terminal 22 and 24. If diodes CR4 and CR5 and transistors Q9 and Q10 are all constructed from the same semi-conductor material, the forward bias on the transistors' bases will ordinarily be large enough to cause both transistors to conduct in the steady state. When a signal appears at input terminal 18, the appropriate transistor will conduct additional current in order to bring output terminal 20 to the same potential as input terminal 18. In the absence of resistors R5 and R6, the steady state current is highly temperature sensitive and might be great enough to destroy the transistors. In the presence of resistors R5 and R6, the steady state current flows through both resistors in series and generates a voltage differential between the emitters of Q9 and Q10 which tends to bias the transistors off and results in stabilization of the steady state current through the transistors. In many cases the same current stabilization can be obtained by using only one of resistors R5 and R6, the other being replaced by a direct connection. This, however, will cause the gate to have a polarity-dependent output impedance, which may be undesirable. If diodes CR4 and CR5 are germanium diodes and Q9 and Q10 are silicon transistors, the forward bias due to the diode drops will not be large enough to cause the transistors to conduct any substantial current and resistors R5 and R6 may be omitted. Although this mode of operation minimizes the demands which Q9 and Q10 make on the power supply, it also permits the voltage on output terminal 20 to differ from that on input terminal 18 by several tenths of a volt.

In the linear mode of operation the steady state current passing between control terminals 22 and 24 should be equal to the maximum base drive current which it is desired to apply to transistors Q9 and Q10, in response to an input signal. The maximum base drive current is in turn determined by the transistor gain and the maximum current which the transistors are to be permitted to pass. Any attempt to exceed this base drive current by increasing the input signal at terminal 18 will cause one of the diodes to become reverse biased with a resulting reversion to the current limited mode of operation described previously. Since R7 and R8 appear in parallel as a load to ground from input terminal 18 when the gate is turned on, the base drive current should be made as low as practicable by making R7 and R8 as large as possible in order to reduce this load at the input terminal. It is, however, a feature of the invention that resistors R7 and R8 need only pass the base drive current for transistors Q9 and Q10, whereas in prior art gates it would be necessary to pass the gate output current, which may be larger by a factor on the order of 100. When the polarity at control terminals 22 and 24 is reversed, the gate will be opened, exactly as described previously. To assure that the gate remains open terminal 22 should be more positive than the most positive signal expected at terminal 18 and terminal 24 should be more negative than the most negative input signal.

Figure 2:
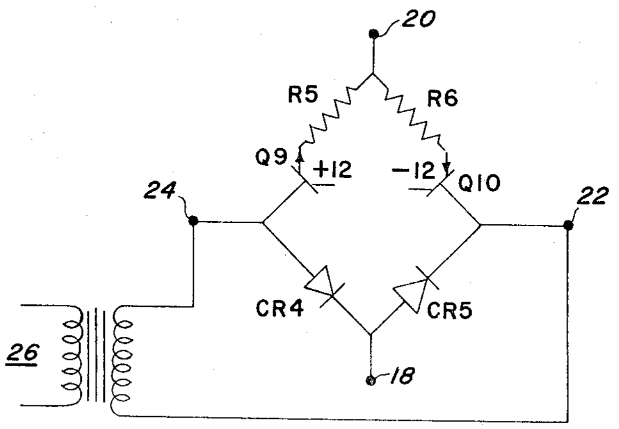
FIG. 2 shows a gate with a transformer drive circuit.

FIG. 2 illustrates how the gate may be controlled through a transformer 26. This is a desirable mode of operation where the gate is to be opened and closed at a rapid rate, since the gate drive circuit does not appear as a load at input terminal 18. A resistor, not shown, may be employed in series with the transformer secondary if the control current would otherwise be greater than desired.

Figure 3:
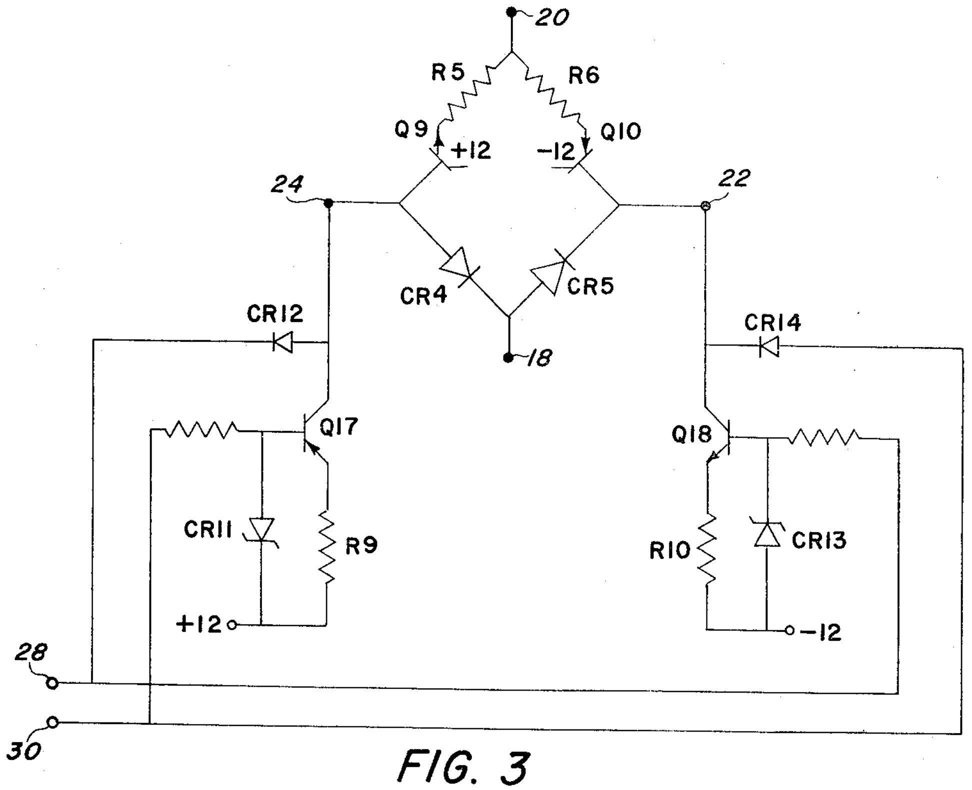
FIG. 3 shows a gate with a constant current drive circuit.

FIG. 3 illustrates a different arrangement for driving the gate. Terminals 28 and 30 are illustratively adapted to receive a reversible positive and negative 12 volt control signal, such as that from transistors Q15 and Q16 of FIG. 1. Assuming that terminal 28 is initially at plus 12 volts and terminal 30 at minus 12 volts, the base of transistor Q17 will then be several volts less positive than the emitter supply potential as determined by Zener diode CR11. The collector current of Q17, as supplied to control terminal 24, will be a constant current such that the voltage drop across emitter resistor R9 will equal the voltage drop across Zener diode CR11. Diode CR12 will be back biased by the plus 12 volt potential on terminal 28. Similarly, transistor Q18 will supply a constant negative current to control terminal 22, as determined by Zener diode CR13 and resistor R10, and diode CR14 will be back biased by the negative potential on terminal 30. The current supplied by transistors Q17 and Q18 should be equal in magnitude, although opposite in polarity. This can be accomplished by making resistors R9 and R10 equal to each other and by making Zener diodes CR11 and CR13 identical to each other. Under these conditions the constant current from transistors Q17 and Q18 flows through diode CR4 and CR5 and causes the gate circuit to be closed exactly as described in connection with FIG. 1. However, the input signal applied at input terminal 18 cannot cause an increment of current to flow through terminals 22 or 24 since the current flowing through those terminals is held fixed. Similarly, since the currents flowing through terminals 22 and 24 are equal, so current from transistors Q17 and Q18 can flow through input terminal 18. Thus, input terminal 18 is effectively isolated from terminals 22 and 24, and vice versa. This result can also be understood by noting that a constant current generator such as transistor Q17 or Q18 is equivalent to an infinite potential in series with an infinite resistance. When the potentials at terminals 28 and 30 are reversed, transistors Q17 and Q18 will be biased off and diodes CR12 and CR14 will be forward biased and will back bias diodes CR4 and CR5, thus opening the gate as described in connection with FIG. 1.

Figures 4, 5:
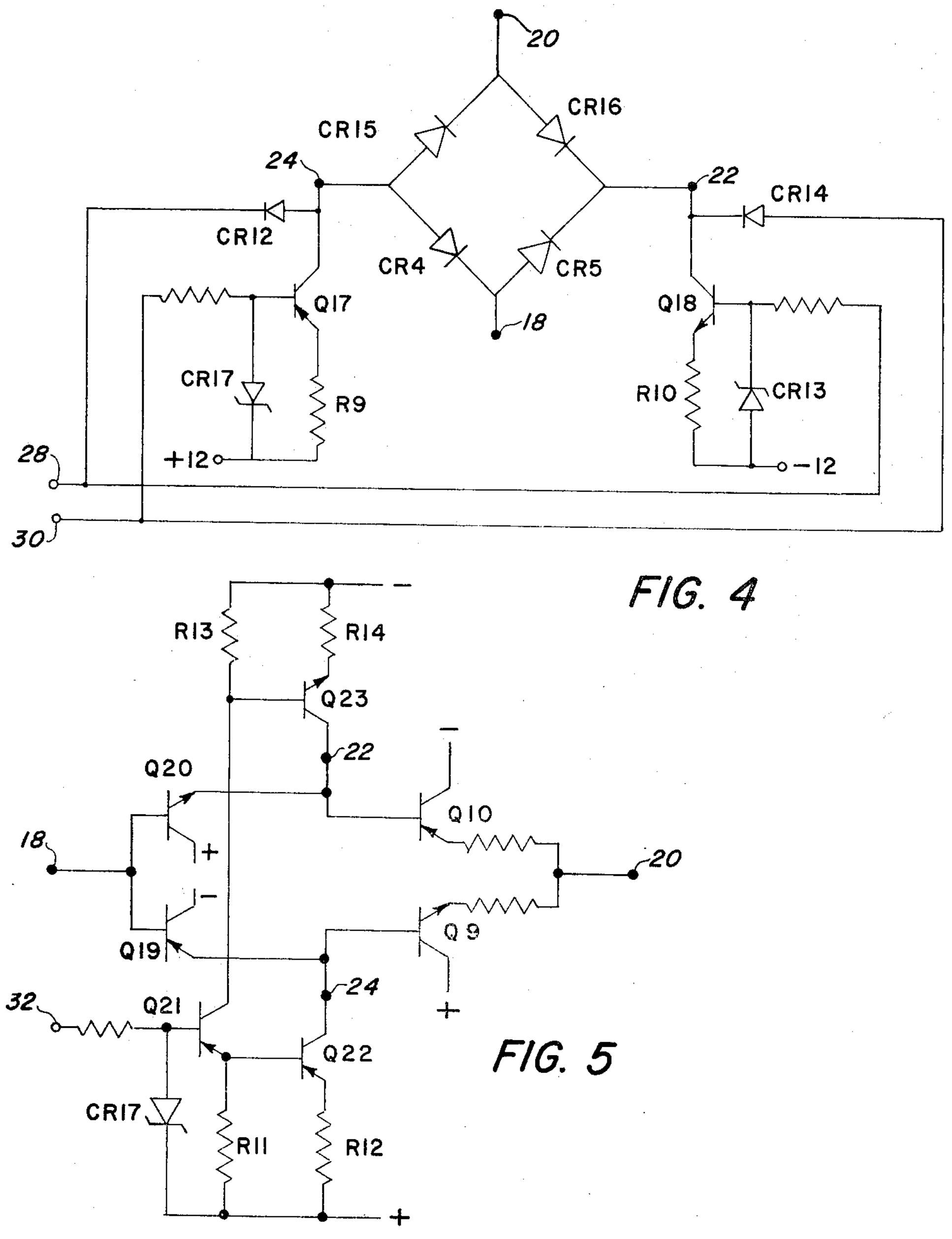
FIG. 4 shows a conventional diode gate with a constant current drive circuit.
FIG. 5 shows a modified gate and a drive circuit according to the invention.

FIG. 4 illustrates the drive circuit of FIG. 3 used in connection with a conventional four-diode gate comprising diodes CR4, CR5, CR15 and CR16. Although this gate circuit provides no current amplification between terminals 18 and 20 and requires a control current between terminals 22 and 24 at least equal to the current flowing between terminals 18 and 20, the illustrated drive circuit still provides the capability of random or D-C operation coupled with the low loading characteristics normally achieved only with the transformer drive circuit of FIG. 2.

It will be understood that the drive circuit shown in FIGS. 3 and 4 is illustrative only, and that other circuit configurations may be employed including the use of more sophisticated constant current generators more nearly approximating the idealized infinite impedance characteristics. A single constant current generator connected between terminals 22 and 24 is desirable and feasible, but it will generally be much simpler to provide two balanced constant current generators connected to terminals 22 and 24 respectively, and to sources of fixed potential such as the illustrated plus 12 and minus 12 volt supply potentials. The use of the term "constant current generator" in the claims is intended to encompass either configuration, unless otherwise qualified.

FIG. 5 shows a modified form of gate according to the invention in which diode CR4 and CR5 are replaced by transistors Q19 and Q20 respectively. When control terminal 24 is connected to a positive supply potential and terminal 22 to a negative supply potential the bases of transistors Q9 and Q10 will both be at the potential of input terminal 18, except for the base emitter diode drop across transistors Q19 and Q20. However, the current supplied to the bases of transistors Q9 and Q10 by transistors Q19 and Q20 will be greater than that supplied at input terminal 18 by a factor corresponding to the current amplification of transistors Q19 and Q20. The current gain of the gate will accordingly be very high, being the product of the current gain of transistors Q9 and Q19 or Q10 and Q20. Since the control terminals 22 and 24 are connected to the emitters of transistors Q19 and Q20 whereas input terminal 18 is connected to the bases of these transistors, substantially none of the control current will flow through input terminal 18 and there is provided a high degree of isolation between the control circuit and the signal circuit. The gate is illustrated in connection with a modified single-input constant-current drive circuit, although the gate and the drive circuit need not be used in connection with each other and a constant current drive circuit is not in fact required. A negative voltage applied to terminal 32 will cause the transistor Q21 to conduct and transfer the potential of Zener diode CR17 to the base of Q22, which delivers a constant to terminal 24 in conjunction with resistor R12. Transistor Q21 itself supplies a constant current to resistor R13 because of the presence of emitter resistor R11. R13 supplies the constant base voltage to Q23 which supplies a constant current to terminal 22 in conjunction with emitter resistor R14. Resistor R13 and/or other components should be adjusted so that the current supply to terminals 22 and 24 are equal. A positive voltage applied to terminal 32 will remove the control current from terminals 22 and 24 and open the gate. No reverse control voltage is required for this configuration because transistor Q9 is of opposite conductivity type from transistor Q19, and transistor Q10 is of opposite conductivity type from Q20. Accordingly, a voltage at input terminal 18 may forward bias the base-emitter junction of Q19 or Q20, but any resulting emitter current will be blocked by the corresponding base-emitter junction of Q9 or Q10. Similarly, a voltage at output terminal 20 may forward bias the emitter-base junction of Q9 or Q10, but any resulting base current will be blocked by the corresponding emitter-base junction of Q19 or Q20.

The foregoing figures and description are illustrative rather than definitive of the invention and numerous circuit variations can be made without departing from the teachings of the invention. Such variations include, without being limited thereto, substitution of compound transistors such as cascaded emitter followers or Darlington pairs for the individual transistors shown in the figures and substitution of other types of amplifying devices, such as field effect transistors for the illustrated bipolar transistors. References in the drawings specification or claims to emitter, base and collector terminals are intended to cover corresponding terminals such as the source, gate, and drain terminals of a field effect transistor. Where reference is made to diodes, it will be understood that any type of comparable asymmetrically conductive device may be employed. Accordingly, there is no intention to limit the scope of the invention except in accordance with the claims.

What is claimed is:

1. An amplified gate circuit comprising:

a first PNP transistor, a first NPN transistor the emitters of said transistors being connected to a common output terminal, the collector of said first PNP transistor being connected to a source of negative potential, the collector of said first NPN transistor being connected to a source of positive potential;

resistive impedance means connected between the emitters of said transistors and said output terminal for stabilizing the steady state current through said transistors and preventing excessive current therethrough;

a first diode connected between a common input terminal and the base of said first PNP transistor and poled to carry positive current away from said input terminal;

a second diode connected between said input terminal and the base of said first NPN transistor and poled to carry positive current towards said input terminal; and a second PNP transistor adapted to supply a reversible polarity source of electrical energy connected to the bases of said first PNP transistor and said first NPN transistor for isolating said input terminal from said output terminal during no input signal condition.

2. An amplified gate circuit comprising:

a first PNP transistor, a first NPN transistor the emitters of said first PNP and said first NPN transistors being connected to a common output terminal, the collector of said first PNP transistor being connected to a source of negative potential, the collector of said first NPN transistor being connected to a source of positive potential;

resistive impedance means connected between the emitters of said transistors and said output terminal for stabilizing the steady state current through said transistors and preventing excessive current therethrough;

a second PNP having its emitter connected to the base of said first NPN transistor its base connected to a common input terminal and its collector connected to a source of negative potential, a second NPN transistor having its emitter connected to the base of said first PNP transistor its base connected to said common input terminal and its collector connected to a source of positive potential, and a third PNP transistor adapted to supply a reversible polarity source of electrical energy connected to the bases of said first PNP transistor and said first NPN transistor for isolating said input terminal from said output terminal during no input signal condition.

3. An amplified gate circuit comprising:

a first PNP transistor, a first NPN transistor the emitters of said first PNP and said first NPN transistors being connected to a common output terminal, the collector of said first PNP transistor being connected to a source of negative potential, the collector of said first NPN transistor being connected to a source of positive potential;

a second PNP transistor having its emitter connected to the base of said first NPN transistor its base connected to a common input terminal and its collector connected to a source of negative potential;

a second NPN transistor having its emitter connected to the base of said first PNP transistor its base connected to said common input terminal and its collector connected to a source of positive potential;

a third PNP transistor adapted to supply a reversible polarity source of electrical energy connected to the bases of said first PNP transistor and said first NPN transistor for isolating said input terminal from said output terminal during no input signal condition;

a fourth PNP transistor having its base connected to the emitter of said third PNP transistor, its collector connected to the base of said first NPN transistor and its emitter connected through a resistance to a source of positive potential, and a third NPN transistor having its base connected to the collector of said third PNP transistor its collector connected to the base of said first PNP transistor and its emitter connected through a resistance to a source of negative potential, said third PNP transistor provides an equal and opposite potential on the bases of said third NPN transistor and said fourth PNP transistor so that a constant current is maintained at the bases of said first PNP and said first NPN transistor when said third PNP transistor conducts.

References Cited

UNITED STATES PATENTS

| | | | |
|---|---|---|---|
| 3,159,751 | 12/1964 | Bogdon et al. | 307—257 |
| 2,990,477 | 6/1961 | MacIntyre | 307—257 |
| 3,179,817 | 4/1965 | Bounsall | 307—257 X |
| 3,225,213 | 12/1965 | Hinrichs et al. | 307—257 X |
| 3,284,641 | 11/1966 | St. John | 307—257 X |
| 3,302,039 | 1/1967 | Baker | 307—257 X |

JOHN S. HEYMAN, Primary Examiner

J. D. FREW, Assistant Examiner

U.S. Cl. X.R.

307—255, 257